(12) United States Patent
Lim et al.

(10) Patent No.: US 7,498,248 B2
(45) Date of Patent: Mar. 3, 2009

(54) METHODS OF COMPENSATING FOR AN ALIGNMENT ERROR DURING FABRICATION OF STRUCTURES ON SEMICONDUCTOR SUBSTRATES

(75) Inventors: Jung-Taek Lim, Gyeonggi-do (KR);
Dong-Chun Lee, Gyeonggi-do (KR);
Young-Jee Yoon, Gyeonggi-do (KR);
Sung-Hong Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 298 days.

(21) Appl. No.: 11/590,072

(22) Filed: Oct. 31, 2006

(65) Prior Publication Data

US 2007/0120220 A1    May 31, 2007

(30) Foreign Application Priority Data

Nov. 30, 2005   (KR) .................. 10-2005-0115326

(51) Int. Cl.
*H01L 21/3205*   (2006.01)
(52) U.S. Cl. ...................................... 438/596
(58) Field of Classification Search ............... None
See application file for complete search history.

(56) References Cited

U.S. PATENT DOCUMENTS

2002/0179966 A1* 12/2002 Yang et al. ............... 257/326
2005/0245057 A1* 11/2005 Yang et al. ............... 438/597

FOREIGN PATENT DOCUMENTS

| JP | 10-326815 | 12/1998 |
|---|---|---|
| KR | 1020030043108 A | 6/2003 |
| KR | 2005-39086 | 4/2005 |

\* cited by examiner

*Primary Examiner*—Charles D. Garber
*Assistant Examiner*—Andre' Stevenson
(74) *Attorney, Agent, or Firm*—Myers Bigel Sibley & Sajovec, P.A.

(57) ABSTRACT

In the methods of compensating for an alignment error during fabrication of structures on semiconductor substrates, a conductive pattern structure is formed at a first position on a first semiconductor substrate. The conductive pattern structure includes a grid of first and second conductive patterns arranged as columns and intersecting rows with openings bounded therebetween. A first conductive contact structure overlaps the conductive pattern structure, and includes a plurality of spaced apart conductive contacts arranged as a grid of rows and columns that can be tilted at a non-zero angle relative to the grid of the conductive pattern structure. A determination is made as to whether the first conductive contact structure is electrically connected to the conductive pattern structure. A second conductive contact structure is formed at a position on a second semiconductor substrate that is determined in response to the determination of whether the first conductive contact structure is electrically connected to the conductive pattern structure.

15 Claims, 12 Drawing Sheets

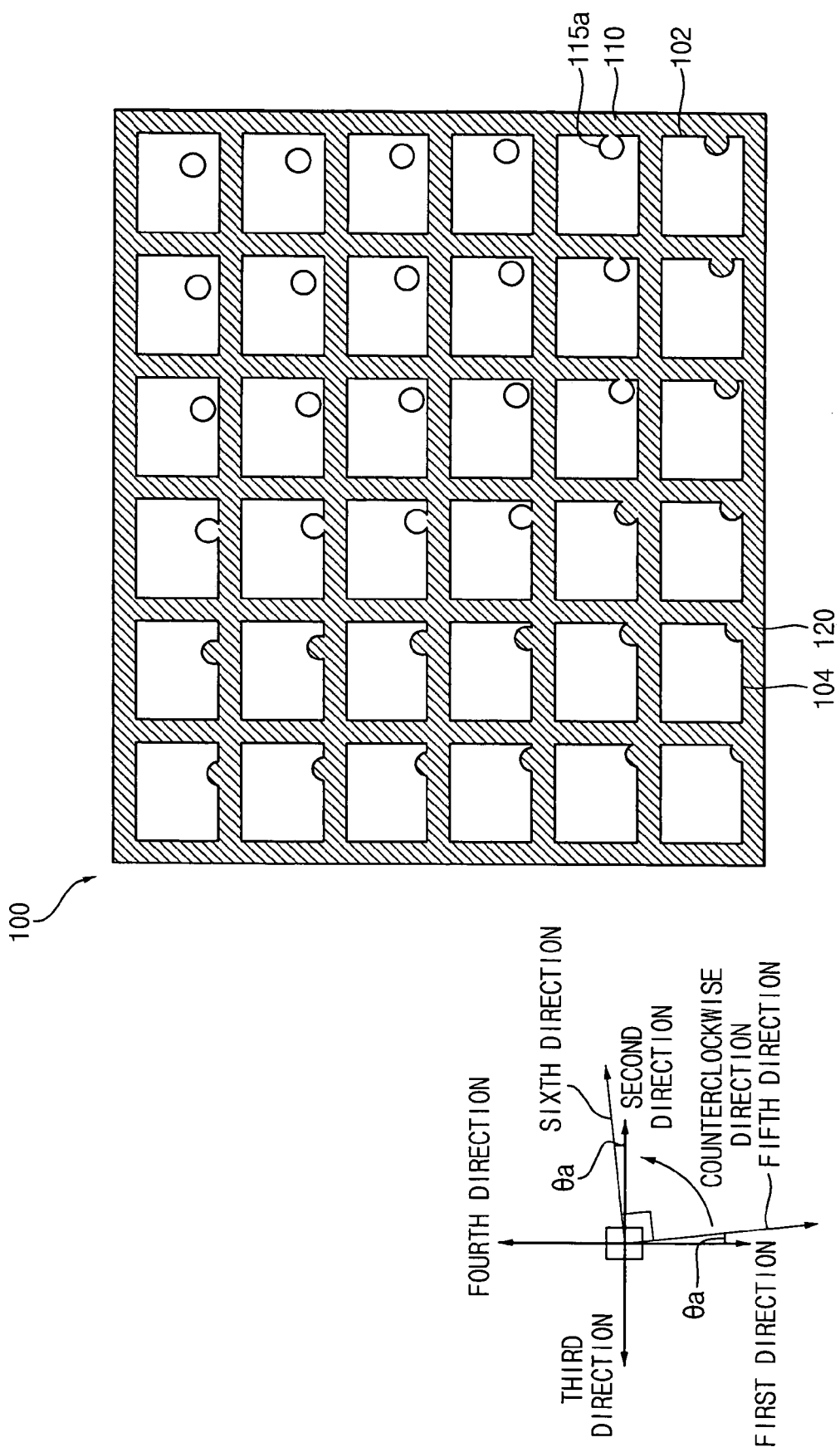

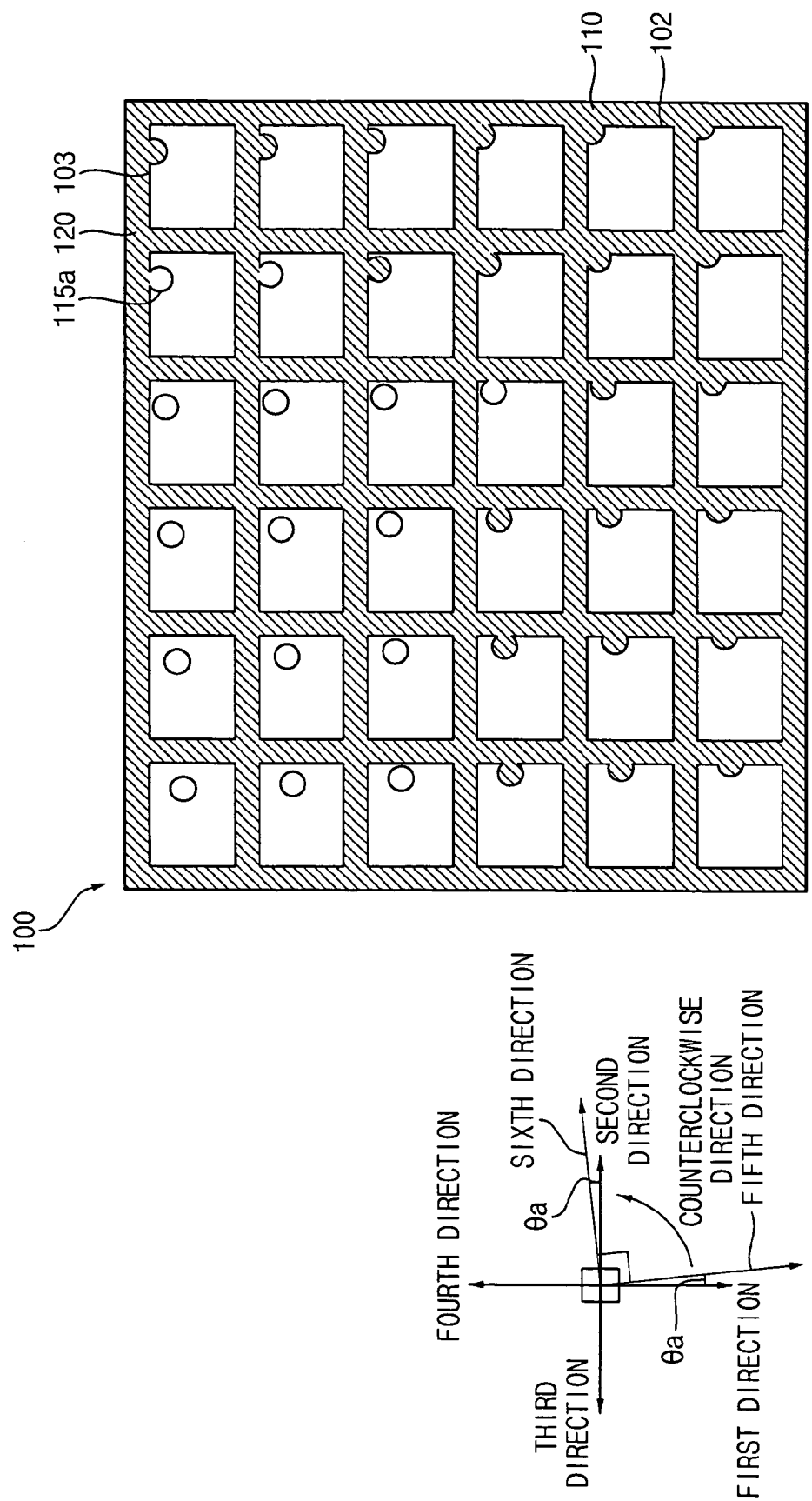

US 7,498,248 B2

METHODS OF COMPENSATING FOR AN ALIGNMENT ERROR DURING FABRICATION OF STRUCTURES ON SEMICONDUCTOR SUBSTRATES

CROSS-REFERENCE TO RELATED APPLICATION

This application claims benefit of priority under 35 U.S.C. § 119 from Korean Patent Application No. 10-2005-0115326 filed on Nov. 30, 2005, the disclosure of which is incorporated herein by reference in its entirety.

FIELD OF THE INVENTION

The present invention relates to methods of fabricating semiconductor devices and, more particularly, to methods of aligning structures fabricated on semiconductor substrates.

BACKGROUND OF THE INVENTION

The reliability of semiconductor devices can be decreased by alignment errors that may occur during fabrication of upper and lower device structures on a semiconductor substrate. Moreover, the effect of such alignment errors on the reliability and/or other characteristics of semiconductor devices may increase as device feature sizes are decreased.

One approach to reducing alignment errors is to have a human operator visually observe and adjust the relative alignment of device structures during their fabrication processes. However, such human visual inspection may increase the elapsed time for the device fabrication process and may be prone to error. Furthermore, the visual inspection needs to be carried out before an opaque layer is formed on the upper and lower structures that are to be inspected.

SUMMARY OF EMBODIMENTS OF THE INVENTION

Methods of compensating for an alignment error during fabrication of structures on semiconductor substrates are disclosed.

According to some embodiments of the present invention, a conductive pattern structure is formed at a first position on a first semiconductor substrate. The conductive pattern structure includes a grid of first conductive patterns arranged as spaced apart columns that intersect and are connected to second conductive patterns arranged as spaced apart rows and that define openings bounded by the first and second conductive patterns. A first conductive contact structure is formed at a second position on the first semiconductor substrate that at least partially overlaps the conductive pattern structure. The first conductive contact structure includes a plurality of spaced apart conductive contacts arranged in columns and rows as a grid that is tilted at a non-zero angle relative to the grid of the conductive pattern structure. A determination is made as to whether the first conductive contact structure is electrically connected to the conductive pattern structure. A second conductive contact structure having substantially the same shape as the first conductive contact structure is formed at a position on a second semiconductor substrate that is determined in response to the determination of whether the first conductive contact structure is electrically connected to the conductive pattern structure.

The second conductive contact structure may be formed at a position on the second semiconductor substrate that is substantially the same as the first position on the first semiconductor substrate when the first conductive contact structure is determined to not be electrically connected to the conductive pattern structure, and may be formed at a position on the second semiconductor substrate that is offset relative to the first position on the first semiconductor substrate when the first conductive contact structure is determined to be electrically connected to the conductive pattern structure. The offset position may be determined based on an amount that the first conductive contact structure would need to be moved to avoid electrical contact between the first conductive contact structure and the conductive pattern structure.

The direction by which the second conductive contact structure is offset on the second semiconductor substrate relative to the first position on the first semiconductor substrate may be varied in response to a determination of where the conductive contacts are electrically connected to respective surfaces of the first and second conductive patterns.

The distance by which the second conductive contact structure is offset on the second semiconductor substrate relative to the first position on the first semiconductor substrate may be varied in response to a determination of how many of the conductive contacts are electrically connected to surfaces of the first and second conductive patterns.

According to some other embodiments of the present invention, a method of compensating for an alignment error during fabrication of structures on semiconductor substrates includes forming a conductive pattern structure at a first position on a first semiconductor substrate, The conductive pattern structure includes first conductive patterns and second conductive patterns. The first conductive patterns extend in a first direction and are arranged substantially parallel to one another. The second conductive patterns extend in a second direction and are arranged substantially parallel to one another. The first conductive patterns intersect and connect to the second conductive patterns and define openings bounded by the first and second conductive patterns. A first conductive contact structure is formed at a second position on the first semiconductor substrate that at least partially overlaps the conductive pattern structure. The first conductive contact structure includes a plurality of conductive contacts spaced apart from one another. At least some of the conductive contacts are arranged within the defined openings bounded by the first and second conductive patterns. A determination is made as to whether the first conductive contact structure is electrically connected to the conductive pattern structure. A second conductive contact structure having substantially the same shape as the first conductive contact structure is formed at a position on a second semiconductor substrate that is determined in response to the determination of whether the first conductive contact structure is electrically connected to the conductive pattern structure. The second semiconductor substrate has substantially the same shape as the first semiconductor substrate.

The first semiconductor substrate may electrically ground the conductive pattern structure during the determination of whether the first conductive contact structure is electrically connected to the conductive pattern structure.

The determination of whether the first conductive contact structure is electrically connected to the conductive pattern structure may be carried out using a scanning electron microscope.

The conductive pattern structure may be formed by forming the first conductive patterns spaced apart from one another by a first distance (D1) along the second direction and with first line widths (W1), and forming the second conductive patterns spaced apart from one another by a second distance (D2) along the first direction and with second line widths (W2). The second conductive contact structure may include forming the conductive pads with centers arranged along a fourth direction offset an acute angle (θa) from the first direction, the conductive pad centers being spaced apart from one another by a distance of about (D2+W2) along the fourth direction. The conductive pad centers may also be arranged along a fifth direction that is substantially perpendicular to the fourth direction and spaced apart from one another by about (D1+W1) along the fifth direction.

Formation of the second conductive contact structure may further include forming the second conductive contact structure at a position on the second semiconductor substrate that is substantially the same as the first position on the first semiconductor substrate when the first conductive contact structure is determined to not be electrically connected to the conductive pattern structure. In contrast, the second conductive contact structure may be formed at a position on the second semiconductor substrate that is offset relative to the first position on the first semiconductor substrate when the first conductive contact structure is determined to be electrically connected to the conductive pattern structure. The offset position may be determined based on an amount that the first conductive contact structure would need to be moved to avoid electrical contact between the first conductive contact structure and the conductive pattern structure.

The conductive pads of the first conductive contact structure may each be formed with a mean cross-sectional radius (Rm). The conductive pattern structure may be formed with a number M of the first conductive patterns and a number N of the second conductive patterns, where M and N are each natural numbers no less than 3. The acute angle (θa) can be a value that is less than about $$\mathrm{Arcsin}\left\{\frac{D_1 - 2R_m}{(N-2)(D_2 + W_2)}\right\}$$

and about $$\mathrm{Arcsin}\left\{\frac{D_2 - 2R_m}{(M-2)(D_1 + W_2)}\right\}.$$

The first conductive patterns may be formed with first sidewalls and second sidewalls, the second sidewalls facing the first sidewalls in a direction substantially opposite to the second direction. The second conductive patterns may be formed with third sidewalls and fourth sidewalls, the third sidewalls facing the fourth sidewalls in a direction substantially opposite to the first direction.

The determination of whether the first conductive contact structure is electrically connected to the conductive pattern structure may include determining a natural number S of the conductive contacts that are electrically connected to the first sidewall of the first conductive pattern along an outermost portion of the conductive pattern structure. The second conductive contact structure may be formed at a position on the second semiconductor substrate that is offset in the second direction relative to the first position on the first semiconductor substrate by about an amount defined by an equation $$S(D_2+W_2)\sin\theta_a.$$

The determination of whether the first conductive contact structure is electrically connected to the conductive pattern structure may include determining a natural number T of the conductive contacts that are electrically connected to the second sidewall of the first conductive pattern along an outermost portion of the conductive pattern structure. The second conductive contact structure may be formed at a position on the second semiconductor substrate that is offset in a direction substantially opposite to the second direction relative to the first position on the first semiconductor substrate by $$T(D_2+W_2)\sin\theta_a$$

about an amount defined an equation

The determination of whether the first conductive contact structure is electrically connected to the conductive pattern structure may include determining a natural number U of the conductive contacts that are electrically connected to the third sidewall of the second conductive pattern along an outermost portion of the conductive pattern structure. The second conductive contact structure may be formed at a position on the second semiconductor substrate that is offset in the first direction relative to the first position on the first semiconductor substrate by about an amount defined by an equation $$U(D_1+W_1)\sin\theta_a$$

The determination of whether the first conductive contact structure is electrically connected to the conductive pattern structure may include determining a natural number V of the conductive contacts that are electrically connected to the fourth sidewall of the second conductive pattern along an outermost portion of the conductive pattern structure. The second conductive contact structure may be formed at a position on the second semiconductor substrate that is offset in a direction substantially opposite to the first direction relative to the first position on the first semiconductor substrate by an about an $$V(D_1+W_1)\sin\theta_a$$

amount defined by an equation

BRIEF DESCRIPTION OF THE DRAWINGS

The above and other features of the present invention will be more readily understood from the following detailed description of exemplary embodiments thereof when read in conjunction with the accompanying drawings, in which:

FIGS. 2 to 12 are plan views illustrating conductive pattern structures and conductive contact structures and related methods of correcting various alignment errors therebetween in accordance with some embodiments of the present invention.

DESCRIPTION OF EMBODIMENTS OF THE INVENTION

Figure 1:
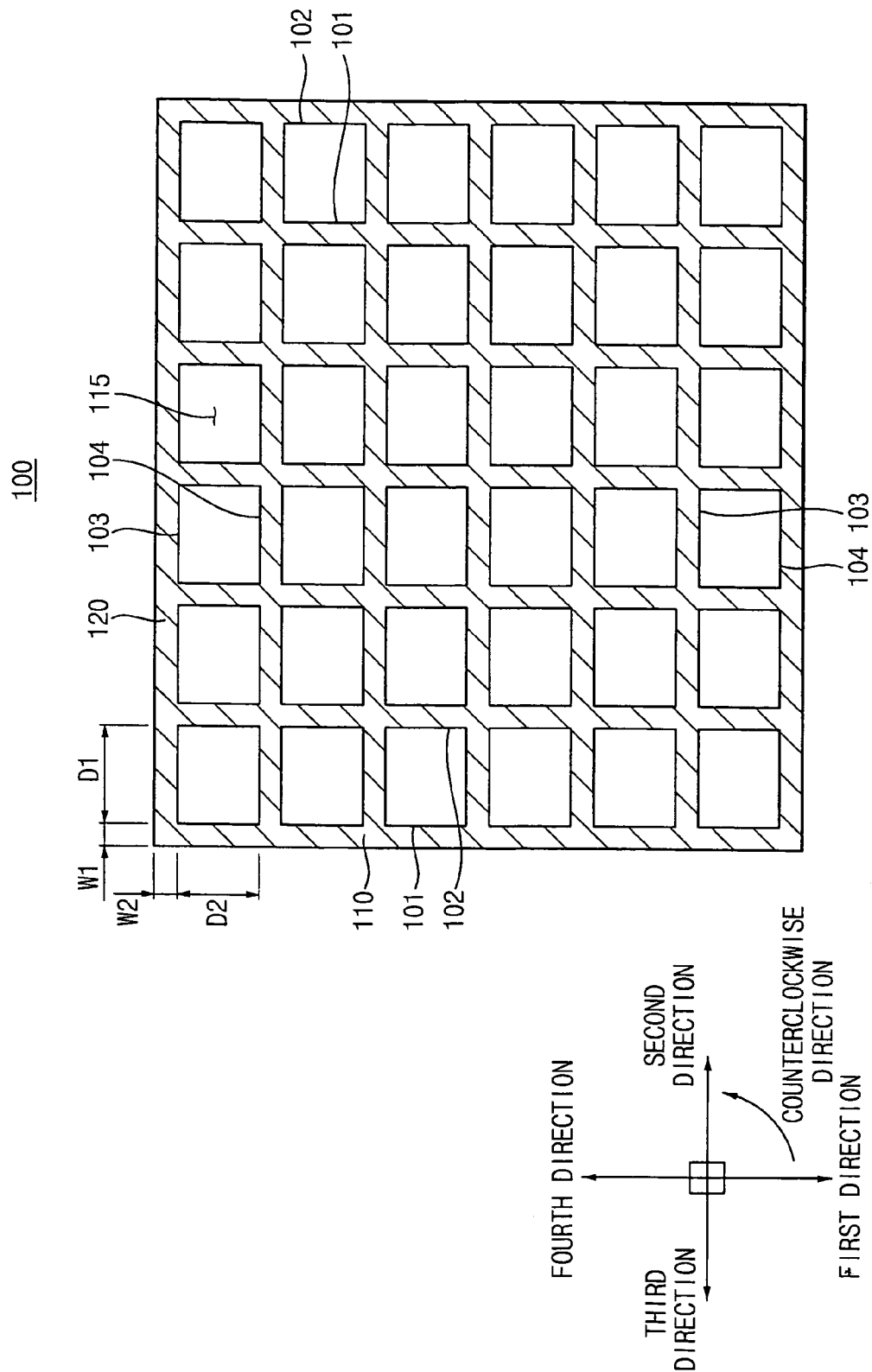
FIG. 1 is a plan view illustrating conductive pattern structures in accordance with some embodiments of the present invention.

Embodiments of the present invention will be described with reference to the accompanying drawings. The present invention may, however, be embodied in many different forms and should not be construed as limited to the embodiments set forth herein. Rather, the embodiments are provided so that disclosure of the present invention will be thorough and complete, and will fully convey the scope of the present invention to those skilled in the art. The principles and features of this invention may be employed in varied and numerous embodiments without departing from the scope of the present invention. In the drawings, the size and relative sizes of patterns, structures and contacts may be exaggerated for clarity. The drawings are not to scale. Like reference numerals designate like elements throughout the drawings.

It will also be understood that when an element or layer is referred to as being "on" and/or "connected to" another patterns, structures or contacts, the patterns, structures or contacts may be directly on and/or directly connected to the other patterns, structures or contacts may be present. As used herein, the term "and/or" includes any and all combinations of one or more of the associated listed items.

It will also be understood that, although the terms first, second, etc. may be used herein to describe various directions, sidewalls, distances, line widths and/or patterns. These directions, sidewalls, distances, line widths and/or patterns should not be limited by these terms. These terms may be used to distinguish one direction, sidewall, distance, line width and/or pattern from another direction, sidewall, distance, line width and/or pattern. For example, a first direction, sidewall, distance, line width and/or pattern discussed below could be termed a second direction, sidewall, distance, line width and/or pattern without departing from the teachings of the present invention.

Spatially relative terms, such as "lower," "upper" and the like may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures.

The terminology used herein is for the purpose of describing particular embodiments only and is not intended to limit of the invention. As used herein, the singular terms "a," "an" and "the" are intended to include the plural forms as well, unless the context clearly indicates otherwise. It will be further understood that the terms "includes" and/or "including," when used in this specification, specify the presence of stated features, integers, steps, operations, elements, and/or components, but do not preclude the presence and/or addition of one or more other features, integers, steps, operations, elements, components, and/or groups thereof.

Unless otherwise defined, all terms (including technical and scientific terms) used herein may have the same meaning as what is commonly understood by one of ordinary skill in the art. It will be further understood that terms, such as those defined in commonly used dictionaries, should be interpreted as having a meaning that is consistent with their meaning in the context of this specification and the relevant art and will not be interpreted in an idealized and/or overly formal sense unless expressly so defined herein.

In the description, the term "substrate" used herein may include a structure based on a semiconductor, having a semiconductor surface exposed. It should be understood that such a structure may contain silicon, silicon on insulator, silicon on sapphire, doped or undoped silicon, an epitaxial layer supported by a semiconductor substrate, or another structure of a semiconductor. And, the semiconductor is not limited to silicon and may be silicon-germanium, germanium, germanium arsenide, and/or any other semiconductor material. In addition, the substrate described hereinafter may be one in which regions, conductive layers, insulation layers, their patterns, and/or junctions are formed.

FIG. 1 is a plan view illustrating conductive pattern structures in accordance with some embodiments of the present invention.

Referring to FIG. 1, a conductive pattern structure 100 includes first conductive patterns 110 and second conductive patterns 120.

The first conductive patterns 110 extend in a first direction. The first conductive patterns 110 are substantially parallel with one another. The first conductive patterns 110 are spaced apart from one another by first distances D1 in a second direction that is rotated counterclockwise from the first direction by about 90°. The first conductive patterns 110 each have first line widths W1 in the second direction. The first conductive patterns 110 each have first sidewalls 101 and second sidewalls 102. The second sidewalls 102 face the first sidewalls 101 in a third direction substantially opposite to the second direction. Accordingly, the first sidewalls 101 face the second sidewall 102 in the second direction.

Second conductive patterns 120 extend in the second direction. The second conductive patterns 120 are substantially parallel with one another. The second conductive patterns 120 are spaced apart from one another in the first direction by second distances D2. The second conductive patterns 120 have second line widths W2 in the first direction. The second conductive patterns 120 have third sidewalls 103 and fourth sidewalls 104. The fourth sidewalls 104 face the third sidewalls 103 in a fourth direction substantially opposite to the first direction and, accordingly, the third sidewalls 103 face the fourth sidewalls 104 in the first direction.

The second conductive patterns 120 are connected to the first conductive patterns 110 to define openings 115 that are bounded thereby. The openings 115 are bounded by the first sidewalls 101, the second sidewalls 102, the third sidewalls 103 and the fourth sidewalls 104.

The number of the first conductive patterns 110 may be substantially the same as the number of the second conductive patterns 120. The first distance D1 may be substantially the same as the second distance D2. The first line width W1 may be substantially the same as the second line width W2.

The conductive pattern structure 100 is utilized to inspect whether or not conductive contacts inserted into the openings 115 are electrically connected to the conductive pattern structure 100.

FIGS. 2 to 12 are plan views illustrating conductive pattern structures and conductive contact structures and related methods of correcting various alignment errors therebetween in accordance with some embodiments of the present invention.

Figure 2:
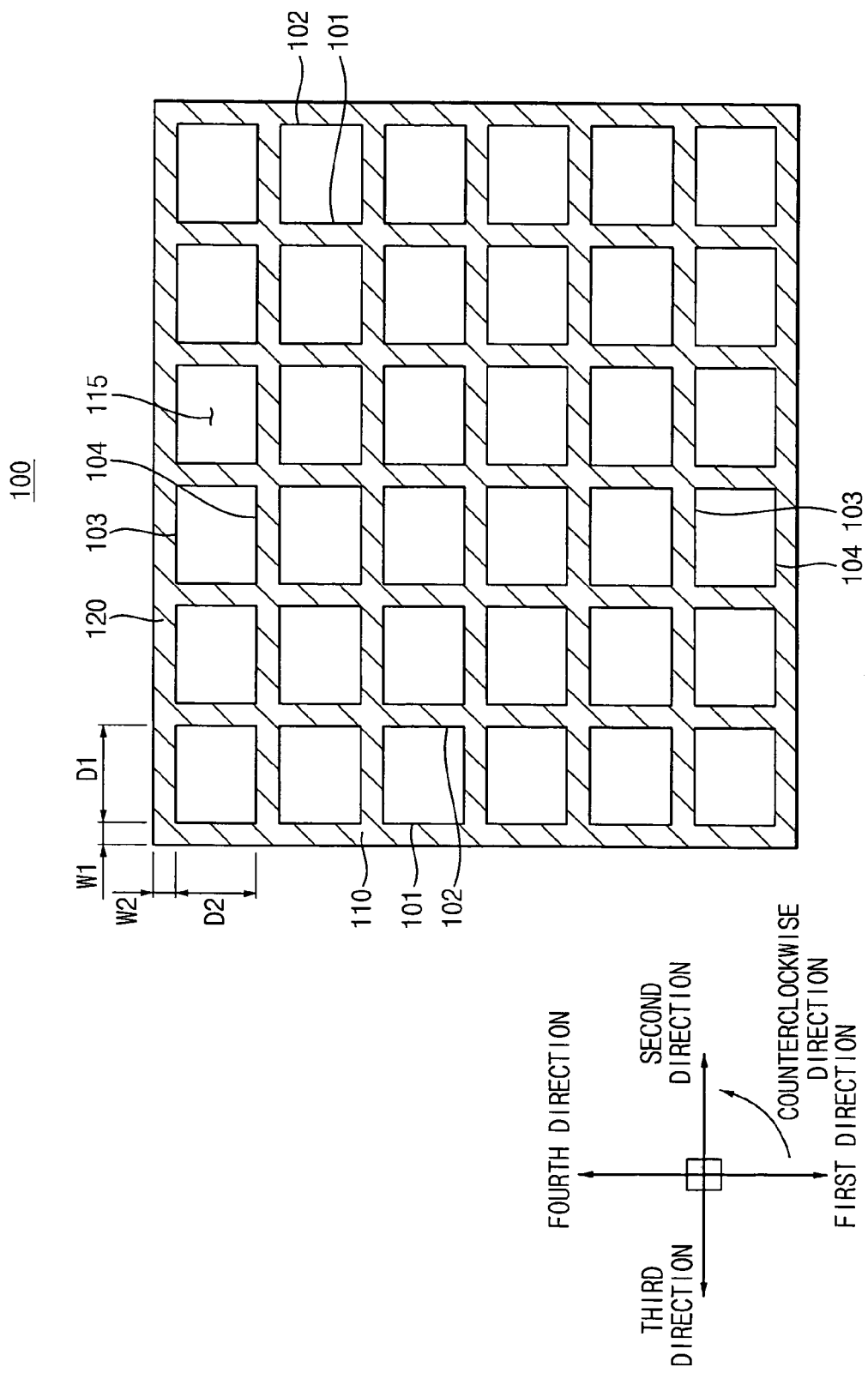

FIG. 2 is a plan view illustrating the conductive pattern structure 100 of FIG. 1 which is formed on a first semiconductor substrate. The conductive pattern structure 100 may use the first semiconductor substrate as a ground so that the first semiconductor substrate is electrically connected to the conductive pattern structure 100. The conductive pattern structure 100 has a first position with respect to the first semiconductor substrate.

The conductive pattern structure 100 of FIG. 2 can be configured as shown and described with regard to FIG. 1, the description of which is not repeated here for brevity. The number of the first conductive patterns 110 can be at least three, and the number of the second conductive patterns 120 can be at least three.

Figure 3:
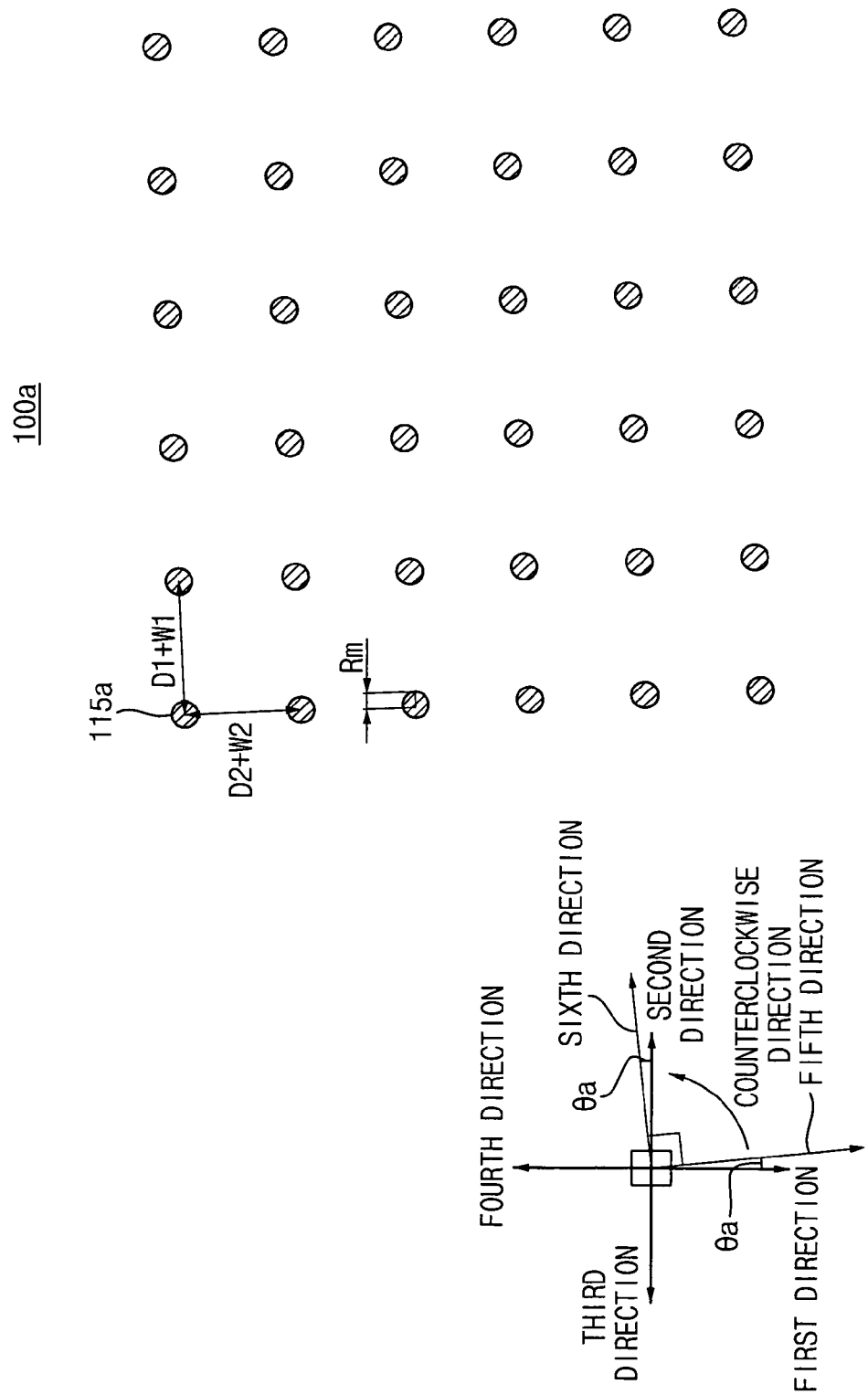

With reference now to FIG. 3, a plan view is shown of a first conductive contact structure 100a that includes conductive contacts 115a formed on the first semiconductor substrate. At least some of the conductive contacts 115a are in the openings 115.

The first conductive contact structure 100a has a second position with respect to the first semiconductor substrate. Central points of the conductive contacts 115a are arranged in a fifth direction that is rotated clockwise or counterclockwise from the first direction by an acute angle θa. The central points of the conductive contacts are spaced apart from one another in the fifth direction by about (D2+W2). In addition, the central points are arranged in a sixth direction that is rotated counterclockwise from the fifth direction by about 90°. The central points are spaced from one another in the sixth direction by about (D1+W1).

A cross section of the conductive contact 115a parallel with an upper face of the conductive pattern structure 100 has a mean radius Rm. For example, the cross section may be a substantial circle or a substantial oval.

When the acute angle θa is a value that is no less than about $$\text{Arcsin}\left\{\frac{D_1 - 2R_m}{(N-2)(D_2 + W_2)}\right\},$$

an electric short may be generated between the conductive contact 115a and the second conductive pattern 120. In addition, when the acute angle θa is a value that is no less than about $$\text{Arcsin}\left\{\frac{D_2 - 2R_m}{(M-2)(D_1 + W_1)}\right\},$$

an electric short may be generated between the conductive contact 115a and the first conductive pattern 110. Thus, the acute angle θa may be a value that is less than about $$\text{Arcsin}\left\{\frac{D_1 - 2R_m}{(N-2)(D_2 + W_2)}\right\}$$

and about $$\text{Arcsin}\left\{\frac{D_2 - 2R_m}{(M-2)(D_1 + W_1)}\right\}.$$

Here, "M" and "N" are the number of the first conductive pattern 110 and the number of the second conductive pattern 120, respectively.

The first conductive structure 100 does not contact the first conductive contact structure 100a (i.e., no electrical short therebetween) and, thus, the structures 100 and 100a can be considered as being aligned (i.e., no alignment error). In contrast, an alignment error between the structures 100 and 100a is identified when the first conductive structure 100 contacts the first conductive contact structure 100a (i.e., an electrical short is present therebetween). A scanning electron microscope (SEM) may be used to determine whether or not an electric short is present between the first conductive structure 100 and the first conductive contact structure 100a.

When the first conductive structure 100 and the first conductive contact structure 100a are aligned (i.e., no electrical short therebetween), a second conductive contact structure having substantially the same shape as the first conductive contact structure 100a is formed at a third position on a second semiconductor substrate. The second semiconductor substrate may have substantially the same shape as the first semiconductor substrate. Because the first conductive structure 100 and the first conductive contact structure 100a were determined to be aligned, the third position can be substantially the same as the second position.

In contrast, when the first conductive structure 100 and the first conductive contact structure 100a are determined to not be aligned (i.e., an electrical short is present therebetween), the second conductive contact structure is formed on the second semiconductor substrate at a fourth position with respect to the second semiconductor substrate. The fourth position is spaced apart (offset) from the second position a distance that can correspond to the distance that the first conductive contact structure 100a would need to be moved to avoid electrical contact with the first conductive structure 100.

When the first sidewall 101 of the first conductive pattern 110 situated at an outermost portion of the conductive pattern structure 100 is electrically connected to S conductive patterns 110 ("S" is a natural number), the fourth position can be spaced apart from the second position in the second direction by a distance of about $S(D_2+W_2)\sin \theta_a$.

When the second sidewall 102 of the first conductive pattern 110 situated at the outermost portion of the conductive pattern structure 100 is electrically connected to T conductive patterns 110 ("T" is a natural number), the fourth position can be spaced apart from the second position in the third direction by a distance of about $T(D_2+W_2)\sin \theta_a$.

When the third sidewall 103 of the second conductive pattern 120 situated at the outermost portion of the conductive pattern structure 100 is electrically connected to U conductive patterns ("U" is a natural number), the fourth position can be spaced apart from the second position in the first direction by a distance of about $U(D_1+W_1)\sin \theta_a$.

When the fourth sidewall 104 of the second conductive pattern 120 situated at the outermost portion of the conductive pattern structure 100 is electrically connected to V conductive patterns ("V" is a natural number), the fourth position can be spaced apart from the second position in the fourth direction by a distance of about $V(D_1+W_1)\sin \theta_a$.

Figure 4:
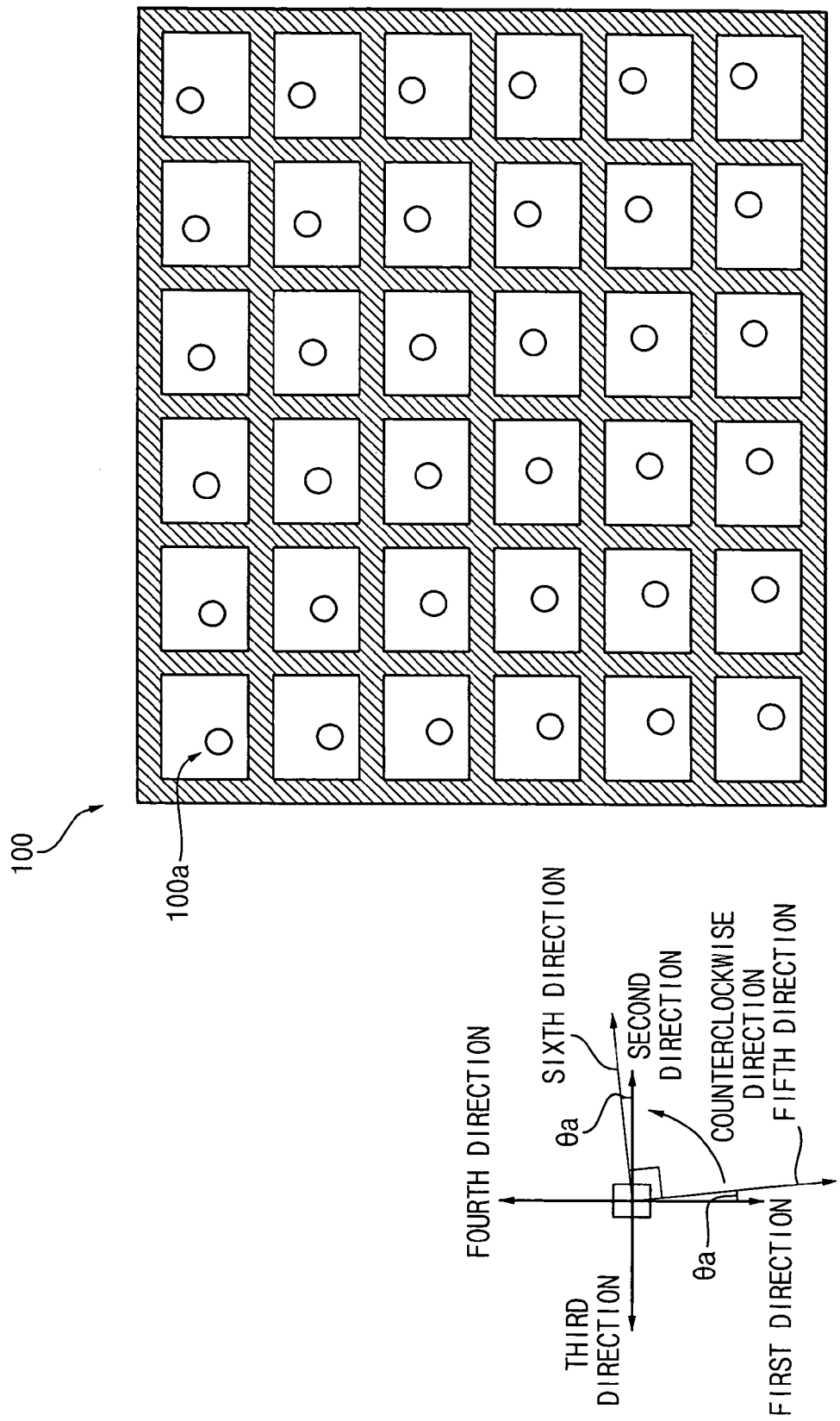

FIG. 4 is a diagrammatic plan view of a SEM picture of the conductive structure 100 and the first conductive contact structure 100a taken when the conductive pattern structure is not electrically connected to the first conductive contact structure 100a. FIGS. 5, 6, 7, 8, 9, 10, 11 and 12 are diagrammatic plan views of SEM pictures of the conductive structure 100 and the first conductive contact structure 100a when various ones of the conductive contacts 115a of the first conductive contact structure 100a electrically contact various sidewall surfaces of the conductive structure 100.

In FIGS. 4 to 12, the conductive contacts 115a of the first conductive contact structure 100a that electrically connect to the conductive pattern structure 100 and are illustrated with the same cross hatching as the conductive pattern structure 100. Similarly, the other conductive contacts 115a that are not electrically connected to the conductive pattern structure 100 are illustrated without cross hatching.

Referring to FIG. 4, none of the conductive contacts 115a of the first conductive contact structure 100a are electrically connected to the conductive pattern structure 100. Accordingly, all of the conductive contacts 115a are illustrated free of cross hatching. Because the first conductive contact structure 100a is therefore aligned with the conductive pattern structure 100, the second conductive contact structure does not need to be offset to compensate for misalignment and can, therefore, be formed at a third position with respect to the second semiconductor substrate which can be substantially the same as the second position of the first conductive contact structure 100a on the first semiconductor substrate.

Figure 5:
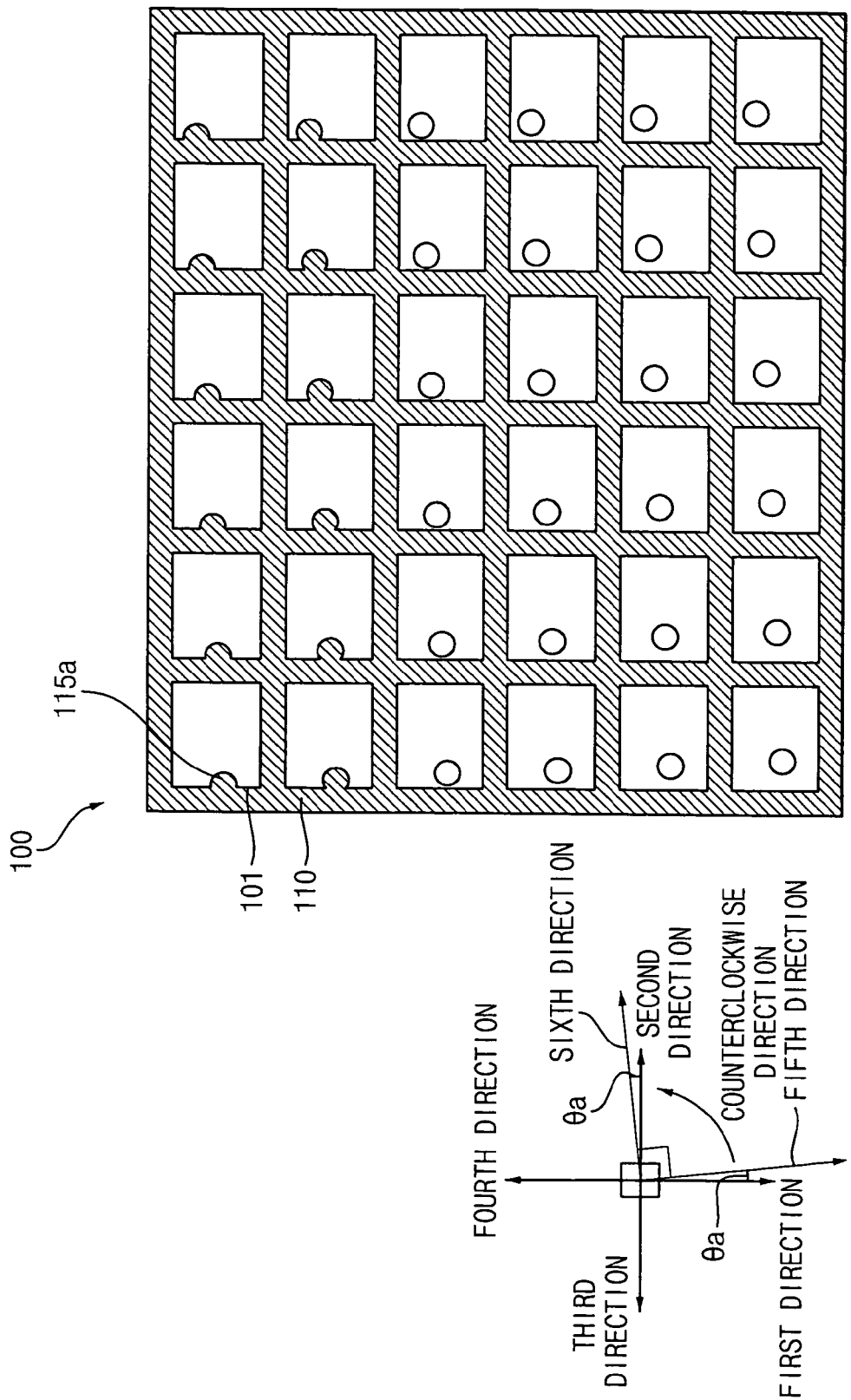

Referring to FIG. 5, the first sidewall 101 of the first conductive pattern 110 situated at the outermost portion of the conductive pattern structure 100 is electrically connected to two conductive contacts 115a. Because the first conductive pattern 110 is not aligned with the first conductive contact structure 100a, the second conductive contact structure is formed at a position on the second substrate that is offset a distance that compensates for the misalignment between the first conductive pattern 110 and the conductive pattern structure 100. The distance and direction that the second conductive contact structure is offset when formed on the second substrate is determined based on how many of the conductive contacts 115a of the first conductive contact structure 100a contact certain sidewall surfaces of the conductive pattern structure 100. For example, the second conductive contact structure can be formed at a fourth position on the second semiconductor substrate, where the fourth position is spaced apart from the second position in the second direction by a distance of about $2(D_2+W_2)\sin\theta_a$ to compensate for (e.g., remove) the alignment error between the first conductive contact structure 100a and the first conductive pattern 110.

Figure 6:
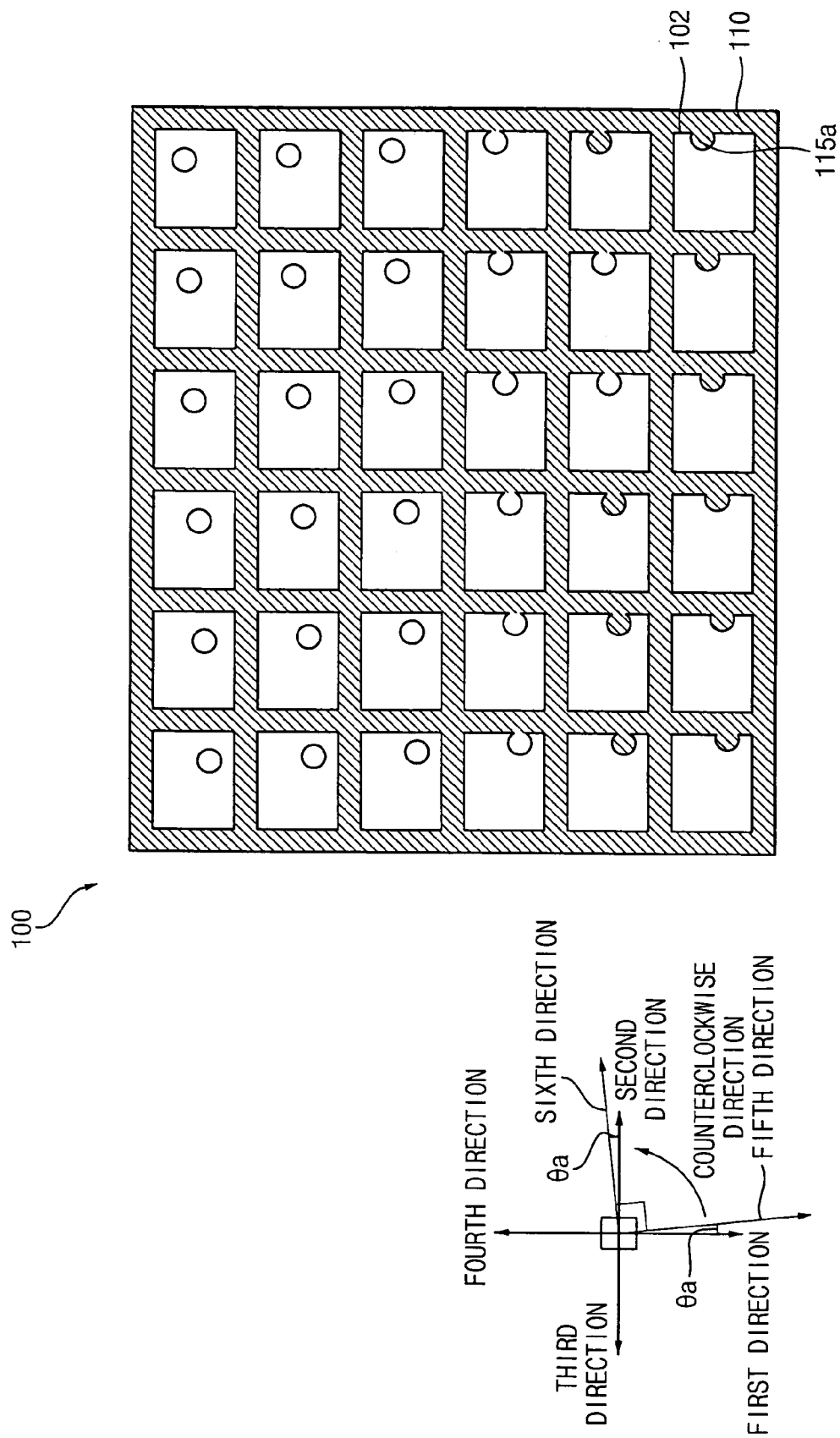

Referring to FIG. 6, the second sidewall 102 of the first conductive pattern 110 situated at the outermost portion of the conductive pattern structure 100 is electrically connected to three conductive contacts 115a. In this case, the second conductive contact structure is formed at an offset fourth position on the second semiconductor substrate, where the fourth position is spaced apart from the second position in the third direction by a distance of about $3(D_2+W_2)\sin\theta_a$ to compensate for (e.g., remove) the alignment error shown in FIG. 6 between the conductive pattern structure 100 and the first conductive contact structure 100a.

Figure 7:
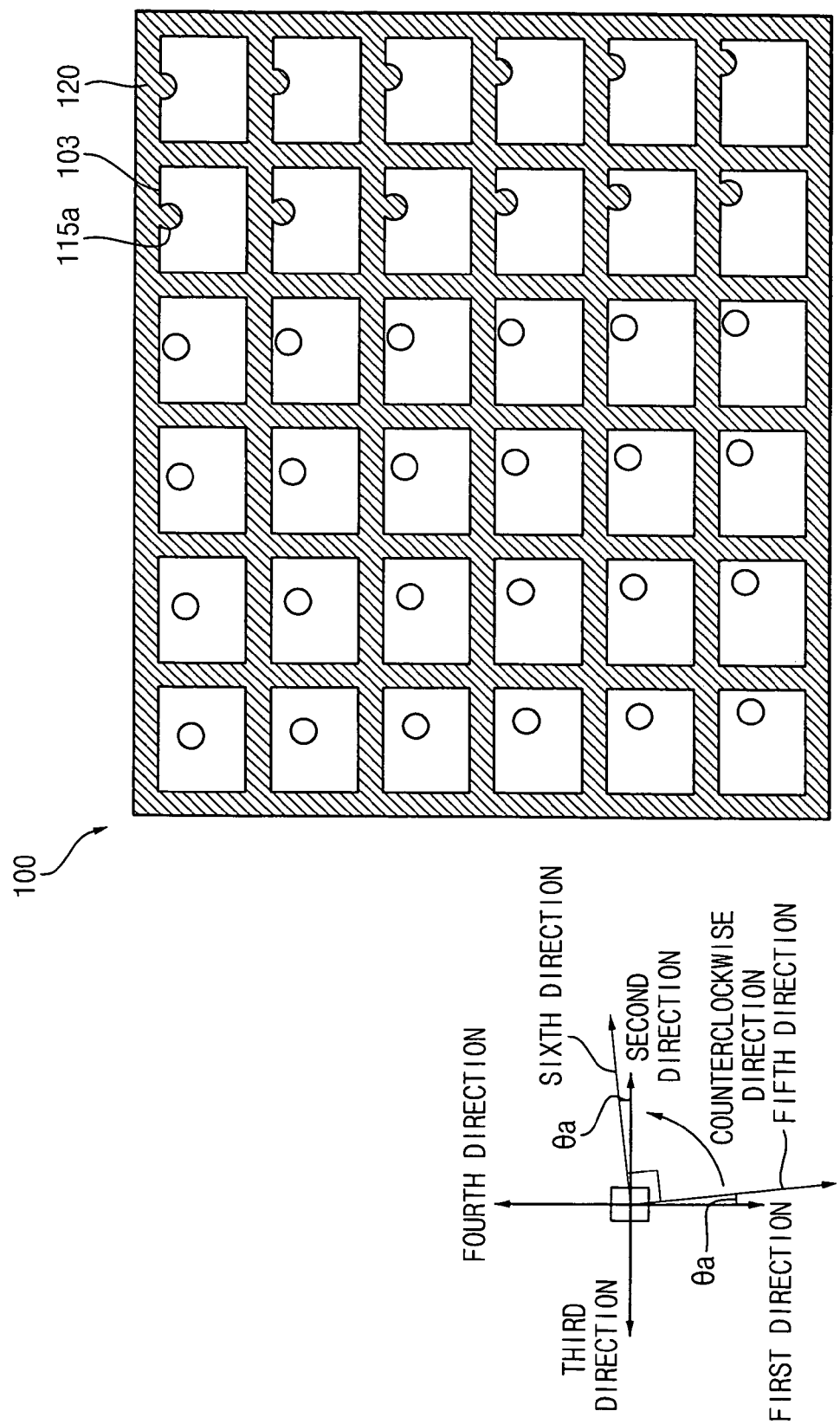

Referring to FIG. 7, the third sidewall 103 of the second conductive pattern situated at the outermost portion of the conductive pattern structure 100 is electrically connected to two conductive contacts 115a. In this case, the second conductive contact structure is formed at an offset fourth position on the second semiconductor substrate, where the fourth position is spaced apart from the second position in the first direction by a distance of about $2(D_1+W_1)\sin\theta_a$ to compensate for (e.g., remove) the alignment error shown in FIG. 7 between the conductive pattern structure 100 and the first conductive contact structure 100a.

Figure 8:
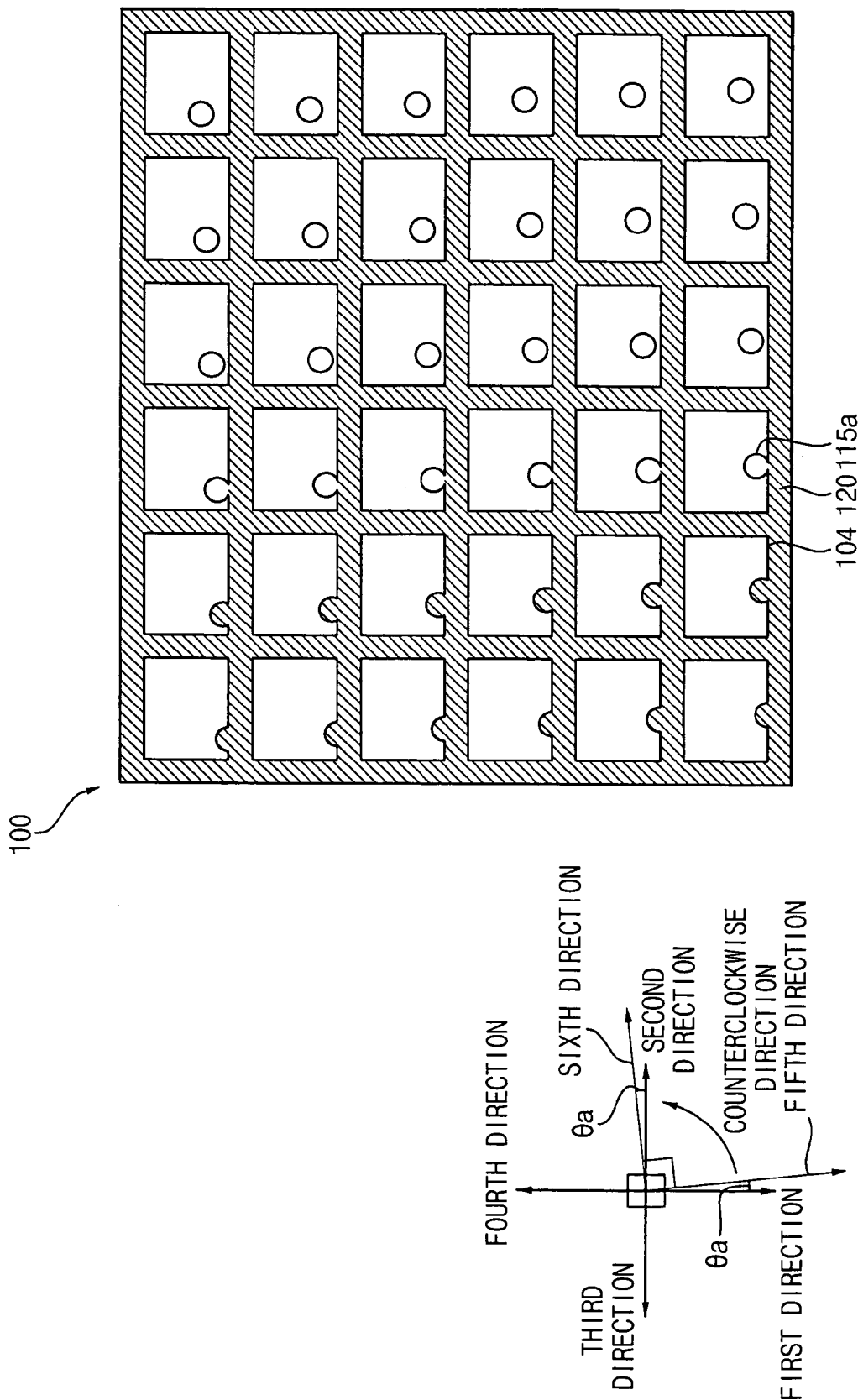

Referring to FIG. 8, the fourth sidewall 104 of the second conductive pattern 120 situated at the outermost portion of the conductive pattern structure 100 is electrically connected to three conductive contacts 115a. In this case, the second conductive contact structure is formed at an offset fourth position on the second semiconductor substrate, where the fourth position is spaced apart from the second position in the fourth direction by about $3(D_1+W_1)\sin\theta_a$ to compensate for (e.g., remove) the alignment error shown in FIG. 8 between the conductive pattern structure 100 and the first conductive contact structure 100a.

Figure 9:
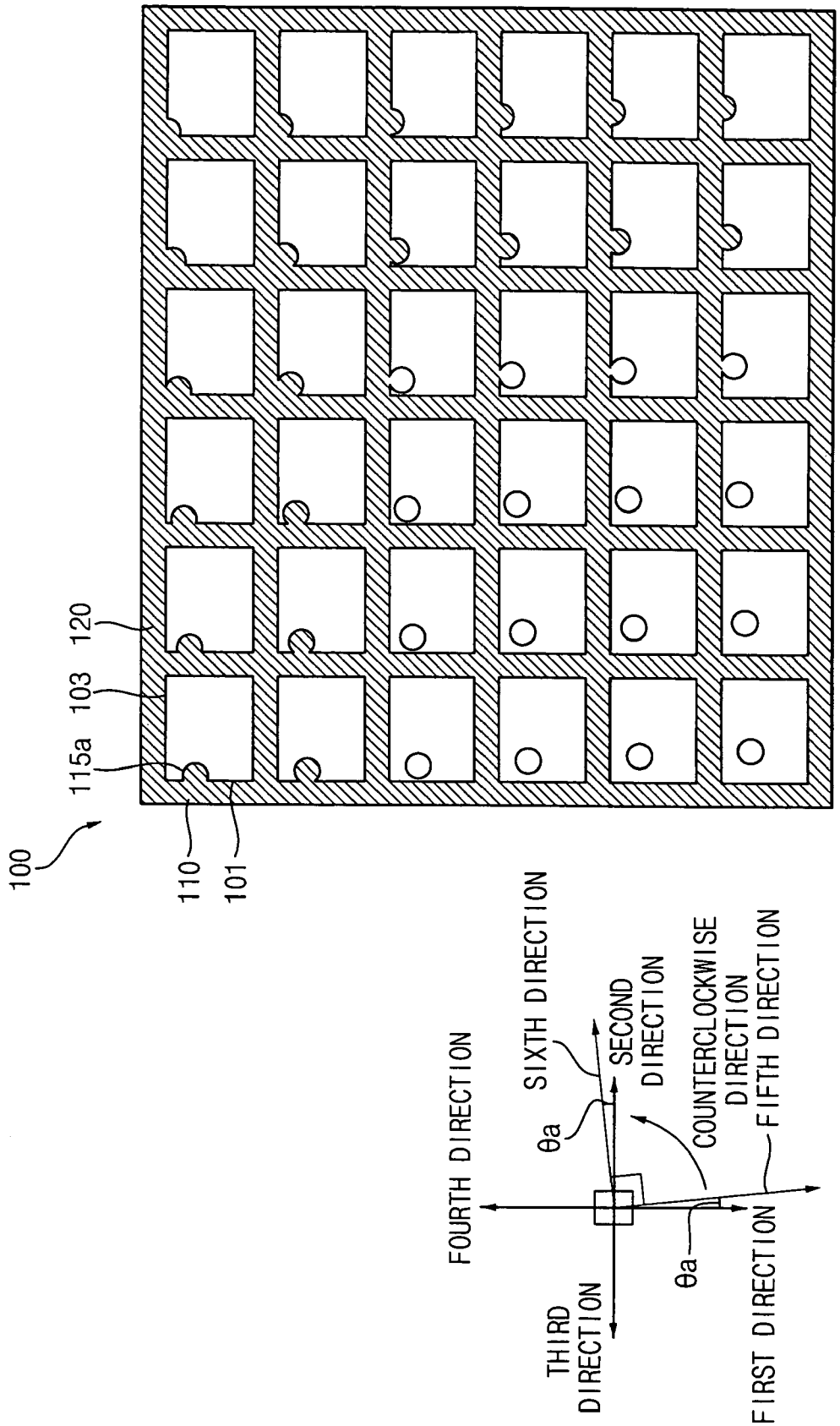

Referring to FIG. 9, the first sidewall 101 of the first conductive pattern 110 situated at the outermost portion of the conductive pattern structure 100 is electrically connected to two conductive contacts 115a. In addition, the third sidewall 103 of the second conductive pattern 120 situated at the outermost portion of the conductive pattern structure 100 is electrically connected to three conductive contacts 115a. In this case, the second conductive contact structure is formed at an offset fourth position on the second semiconductor substrate, where the fourth position is spaced apart from the second position in the second direction by about $2(D_2+W_2)\sin\theta_a$. In addition, the fourth position is spaced apart from the second position in the first direction by about $3(D_1+W_1)\sin\theta a$. Accordingly, the offset fourth position can be defined to compensate for the alignment error shown in FIG. 9 between the conductive pattern structure 100 and the first conductive contact structure 100a.

Figure 10:
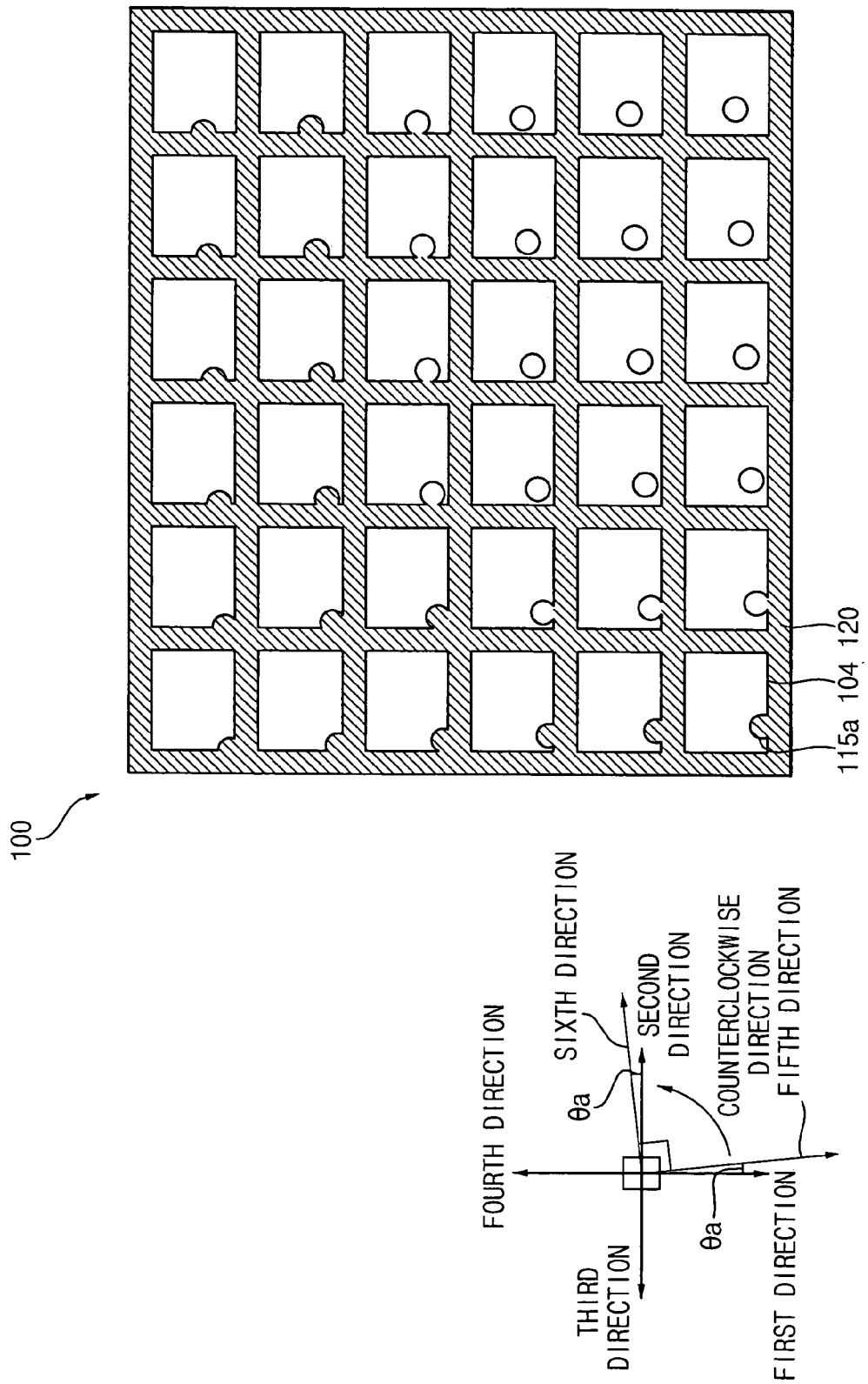

Referring to FIG. 10, the first sidewall 101 of the first conductive pattern 110 situated at the outermost portion of the conductive pattern structure 100 is electrically connected to three conductive contacts 115a. In addition, the fourth sidewall 104 of the second conductive pattern 120 situated at the outermost portion of the conductive pattern structure 100 is electrically connected to two conductive contacts 115a. In this case, the second conductive contact structure is formed at an offset fourth position on the second semiconductor substrate, where the fourth position is spaced apart from the second position in the second direction by about $3(D_2+W_2)\sin\theta_a$. In addition, the fourth position is spaced apart from the second position in the fourth direction by about $2(D_1+W_1)\sin\theta a$. Accordingly, the offset fourth position can be defined to compensate for the alignment error shown in FIG. 10 between the conductive pattern structure 100 and the first conductive contact structure 100a.

Referring to FIG. 11, the second sidewall 102 of the first conductive pattern 110 situated at the outermost portion of the conductive pattern structure 100 is electrically connected to two conductive contacts 115a. In addition, the fourth sidewall 104 of the second conductive pattern 120 situated at the outermost portion of the conductive pattern structure 100 is electrically connected to three conductive contacts 115a. In this case, the second conductive contact structure is formed at an offset fourth position on the second semiconductor substrate, where the fourth position is spaced apart from the second position in the third direction by about $2(D_2+W_2)\sin\theta_a$. In addition, the fourth position is spaced apart from the second position in the second position in the fourth direction by about $3(D_1+W_1)\sin\theta_a$. Accordingly, the offset fourth position can be defined to compensate for the alignment error shown in FIG. 11 between the conductive pattern structure 100 and the first conductive contact structure 100a.

Referring to FIG. 12, the second sidewall 102 of the first conductive pattern 110 situated at the outermost portion of the conductive pattern structure 100 is electrically connected to three conductive contacts 115. In addition, the third sidewall 103 of the second conductive pattern 120 situated at the outermost portion of the conductive pattern structure 100 is electrically connected to two conductive contacts 115a. In this case, the second conductive contact structure is formed at an offset fourth position on the second semiconductor substrate, where the fourth position is spaced apart from the second position in the third direction by about $3(D_2+W_2)\sin\theta_a$. In addition, the fourth position is spaced apart from the second position in the first direction by about $2(D_1+W_1)\sin\theta_a$. Accordingly, the offset fourth position can be defined to compensate for the alignment error shown in FIG. 12 between the conductive pattern structure 100 and the first conductive contact structure 100a.

Using the conductive pattern structure 100 and the first conductive contact structure 100a as described herein to determine relative alignment may reduce the time that is needed to inspect a semiconductor substrate and/or devices thereon for alignment errors, and to correct for alignment errors when forming a second conductive contact structure on another semiconductor substrate.

The foregoing is illustrative of the present invention and is not to be construed as limiting thereof. Although various embodiments of this invention have been described, those skilled in the art will readily appreciate that many modifications are possible in the embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A method of compensating for an alignment error during fabrication of structures on semiconductor substrates, the method comprising:

forming a conductive pattern structure at a first position on a first semiconductor substrate, the conductive pattern structure including first conductive patterns and second conductive patterns, the first conductive patterns extending in a first direction and arranged substantially parallel to one another, the second conductive patterns extending in a second direction and arranged substantially parallel to one another, the first conductive patterns intersecting and connecting to the second conductive patterns and defining openings bounded by the first and second conductive patterns;

forming a first conductive contact structure at a second position on the first semiconductor substrate that at least partially overlaps the conductive pattern structure, the first conductive contact structure including a plurality of conductive contacts spaced apart from one another, at least some of the conductive contacts arranged within the defined openings bounded by the first and second conductive patterns;

determining whether the first conductive contact structure is electrically connected to the conductive pattern structure; and forming a second conductive contact structure having substantially the same shape as the first conductive contact structure at a position on a second semiconductor substrate that is determined in response to the determination of whether the first conductive contact structure is electrically connected to the conductive pattern structure, wherein the second semiconductor substrate has substantially the same shape as the first semiconductor substrate.

2. The method of claim 1, wherein the first semiconductor substrate electrically grounds the conductive pattern structure during the determination of whether the first conductive contact structure is electrically connected to the conductive pattern structure.

3. The method of claim 1, wherein the determination of whether the first conductive contact structure is electrically connected to the conductive pattern structure is carried out using a scanning electron microscope.

4. The method of claim 1, wherein:

forming a conductive pattern structure comprises:

forming the first conductive patterns spaced apart from one another by a first distance (D1) along the second direction and with first line widths (W1); and forming the second conductive patterns spaced apart from one another by a second distance (D2) along the first direction and with second line widths (W2); and forming a second conductive contact structure further comprises forming the conductive pads with centers arranged along a fourth direction offset an acute angle (θa) from the first direction, the conductive pad centers being spaced apart from one another by a distance of about (D2+W2) along the fourth direction, the conductive pad centers also arranged along a fifth direction that is substantially perpendicular to the fourth direction and spaced apart from one another by about (D1+W1) along the fifth direction.

5. The method of claim 4, wherein forming a second conductive contact structure further comprises:

forming the second conductive contact structure at a position on the second semiconductor substrate that is substantially the same as the first position on the first semiconductor substrate when the first conductive contact structure is determined to not be electrically connected to the conductive pattern structure; and forming the second conductive contact structure at a position on the second semiconductor substrate that is offset relative to the first position on the first semiconductor substrate when the first conductive contact structure is determined to be electrically connected to the conductive pattern structure, wherein the offset position is determined based on an amount that the first conductive contact structure would need to be moved to avoid electrical contact between the first conductive contact structure and the conductive pattern structure.

6. The method of claim 5, wherein:

the conductive pads of the first conductive contact structure are each formed with a mean cross-sectional radius (Rm);

the conductive pattern structure is formed with a number M of the first conductive patterns and a number N of the second conductive patterns, wherein M and N are each natural numbers no less than 3; and the acute angle (θa) is a value that is less than about $$\text{Arcsin}\left\{\frac{D_1 - 2R_m}{(N-2)(D_2 + W_2)}\right\}$$

and about $$\text{Arcsin}\left\{\frac{D_2 - 2R_m}{(M-2)(D_1 + W_1)}\right\}.$$

7. The method of claim 5, wherein:

the first conductive patterns are formed with first sidewalls and second sidewalls, the second sidewalls facing the first sidewalls in a direction substantially opposite to the second direction; and the second conductive patterns are formed with third sidewalls and fourth sidewalls, the third sidewalls facing the fourth sidewalls in a direction substantially opposite to the first direction.

8. The method of claim 7, wherein:

determining whether the first conductive contact structure is electrically connected to the conductive pattern structure comprises determining a natural number S of the conductive contacts that are electrically connected to the first sidewall of the first conductive pattern along an outermost portion of the conductive pattern structure; and the second conductive contact structure is formed at a position on the second semiconductor substrate that is offset in the second direction relative to the first position on the first semiconductor substrate by about an amount defined by an equation $$S(D_2+W_2)\sin\theta_a.$$

9. The method of claim 7, wherein:
determining whether the first conductive contact structure is electrically connected to the conductive pattern structure comprises determining a natural number T of the conductive contacts that are electrically connected to the second sidewall of the first conductive pattern along an outermost portion of the conductive pattern structure; and
the second conductive contact structure is formed at a position on the second semiconductor substrate that is offset in a direction substantially opposite to the second direction relative to the first position on the first semiconductor substrate by about an amount defined an equation $$T(D_2+W_2)\sin\theta_a.$$

10. The method of claim 7, wherein:
determining whether the first conductive contact structure is electrically connected to the conductive pattern structure comprises determining a natural number U of the conductive contacts that are electrically connected to the third sidewall of the second conductive pattern along an outermost portion of the conductive pattern structure; and
the second conductive contact structure is formed at a position on the second semiconductor substrate that is offset in the first direction relative to the first position on the first semiconductor substrate by about an amount defined by an equation $$U(D_1+W_1)\sin\theta_a.$$

11. The method of claim 7, wherein:
determining whether the first conductive contact structure is electrically connected to the conductive pattern structure comprises determining a natural number V of the conductive contacts that are electrically connected to the fourth sidewall of the second conductive pattern along an outermost portion of the conductive pattern structure; and
the second conductive contact structure is formed at a position on the second semiconductor substrate that is offset in a direction substantially opposite to the first direction relative to the first position on the first semiconductor substrate by about an amount defined by an equation $$V(D_1+W_1)\sin\theta_a.$$

12. A method of compensating for an alignment error during fabrication of structures on semiconductor substrates, the method comprising:
forming a conductive pattern structure at a first position on a first semiconductor substrate, the conductive pattern structure including a grid of first conductive patterns arranged as spaced apart columns that intersect and are connected to second conductive patterns arranged as spaced apart rows and that define openings bounded by the first and second conductive patterns;
forming a first conductive contact structure at a second position on the first semiconductor substrate that at least partially overlaps the conductive pattern structure, the first conductive contact structure including a plurality of spaced apart conductive contacts arranged in columns and rows as a grid that is tilted at a non-zero angle relative to the grid of the conductive pattern structure;
determining whether the first conductive contact structure is electrically connected to the conductive pattern structure; and
forming a second conductive contact structure having substantially the same shape as the first conductive contact structure at a position on a second semiconductor substrate that is determined in response to the determination of whether the first conductive contact structure is electrically connected to the conductive pattern structure.

13. The method of claim 12, wherein forming a second conductive contact structure further comprises:
forming the second conductive contact structure at a position on the second semiconductor substrate that is substantially the same as the first position on the first semiconductor substrate when the first conductive contact structure is determined to not be electrically connected to the conductive pattern structure; and
forming the second conductive contact structure at a position on the second semiconductor substrate that is offset relative to the first position on the first semiconductor substrate when the first conductive contact structure is determined to be electrically connected to the conductive pattern structure, wherein the offset position is determined based on an amount that the first conductive contact structure would need to be moved to avoid electrical contact between the first conductive contact structure and the conductive pattern structure.

14. The method of claim 13, further comprising varying the direction by which the second conductive contact structure is offset on the second semiconductor substrate relative to the first position on the first semiconductor substrate in response to a determination of where the conductive contacts are electrically connected to respective surfaces of the first and second conductive patterns.

15. The method of claim 14, further comprising varying the distance by which the second conductive contact structure is offset on the second semiconductor substrate relative to the first position on the first semiconductor substrate in response to a determination of how many of the conductive contacts are electrically connected to surfaces of the first and second conductive patterns.

* * * * *

UNITED STATES PATENT AND TRADEMARK OFFICE
CERTIFICATE OF CORRECTION

PATENT NO. : 7,498,248 B2
APPLICATION NO. : 11/590072
DATED : March 3, 2009
INVENTOR(S) : Lim et al.

Page 1 of 1

It is certified that error appears in the above-identified patent and that said Letters Patent is hereby corrected as shown below:

Column 3, Line 44: Please correct in the equation "$(M-2)(D_1+W_2)$"
to read -- $(M-2)(D_2+W_2)$ --

Signed and Sealed this

Twentieth Day of July, 2010

David J. Kappos
*Director of the United States Patent and Trademark Office*